(12) United States Patent
Becker et al.

(10) Patent No.: US 12,350,720 B2
(45) Date of Patent: Jul. 8, 2025

(54) ADJUSTABLE HEIGHT SPRAY SYSTEM FOR CLEANER

(71) Applicant: Illinois Tool Works Inc., Glenview, IL (US)

(72) Inventors: Eric Wayne Becker, Phillipsburg, MO (US); Michael Brainard, Lebanon, MO (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 18/210,877

(22) Filed: Jun. 16, 2023

(65) Prior Publication Data
US 2024/0416391 A1 Dec. 19, 2024

(51) Int. Cl.
*B08B 3/02* (2006.01)
*H01L 21/67* (2006.01)

(52) U.S. Cl.
CPC ........ *B08B 3/022* (2013.01); *H01L 21/67051* (2013.01); *B08B 2203/02* (2013.01); *H05K 2203/0746* (2013.01)

(58) Field of Classification Search
CPC ............ B08B 3/022; B08B 2203/0211; H05K 3/0085; H05K 3/0055; H01L 21/67051
See application file for complete search history.

(56) References Cited

U.S. PATENT DOCUMENTS

| | | |
|---|---|---|
| 4,946,513 A | 8/1990 | Del Prato et al. |
| 5,226,962 A | 7/1993 | Burke et al. |
| 2002/0192391 A1 | 12/2002 | Wada et al. |
| 2016/0059380 A1 | 3/2016 | Yamaguchi et al. |
| 2018/0221925 A1 | 8/2018 | Ito et al. |
| 2023/0205235 A1 | 6/2023 | Kim et al. |

FOREIGN PATENT DOCUMENTS

| | | | |
|---|---|---|---|
| CN | 104080948 A | | 10/2014 |
| CN | 210670813 U | * | 6/2020 |
| CN | 212625508 U | | 2/2021 |
| CN | 113414165 A | | 9/2021 |
| JP | 2000173963 A | | 6/2000 |
| KR | 20070114875 A | | 12/2007 |
| WO | 2022009661 A1 | | 1/2022 |

OTHER PUBLICATIONS

Machine translation CN210670813 (Year: 2020).*

* cited by examiner

*Primary Examiner* — Natasha N Campbell
(74) *Attorney, Agent, or Firm* — Lando & Anastasi, LLP

(57) ABSTRACT

A cleaning apparatus is configured to clean electronic substrates including printed circuit boards and semiconductor product assemblies. The cleaning apparatus includes at least one cleaning module configured to treat electronic substrates and a conveyor system configured to transport the electronic substrates through the at least one cleaning module. The at least one cleaning module includes a spray system having a manifold connected to a source of fluid and a plurality of spray bars fluidly coupled to the manifold, and an adjustable height spray system configured to move the manifold and the plurality of spray bars up and down with respect to the conveyor system.

18 Claims, 8 Drawing Sheets

ADJUSTABLE HEIGHT SPRAY SYSTEM FOR CLEANER

BACKGROUND OF THE DISCLOSURE

1. Field of the Disclosure

This application relates generally to an apparatus for cleaning electronic substrates, including printed circuit boards and semiconductor product assemblies, and, more particularly, to a system and a method to adjust a height of a spray system of the cleaning apparatus.

2. Discussion of Related Art

Various types of liquid cleaning apparatus, often referred to as cleaners, are used to clean electronic substrates to remove of contaminates, such as flux residues, resins and the like. These contaminates remain on the electronic substrate from the soldering process.

The soldering process has recently advanced in two significant ways—the transition from tin-lead solder to lead-free materials and the reduction in the size of electronic substrate and the associated increase in the density of smaller, low-profile components. These new soldering materials have increased temperature requirements for soldering and are typically formulated to have higher flux content by weight. The combination of lead-free processes and new electronic substrate designs are demanding more time and energy to meet industry cleanliness standards.

Cleaners are used to clean unwanted materials left by the soldering process from the electronic substrate. Such cleaners are equipped with one or more cleaning modules to clean the electronic substrate. Presently, to adjust a height of a spray system within the cleaning module of the cleaner requires manually adjusting the spray system, which is time consuming and inconvenient.

SUMMARY OF THE DISCLOSURE

One aspect of the present disclosure is directed to a cleaning apparatus for cleaning electronic substrates including printed circuit boards and semiconductor product assemblies. In one embodiment, the cleaning apparatus comprises at least one cleaning module configured to treat electronic substrates and a conveyor system configured to transport the electronic substrates through the at least one cleaning module. The at least one cleaning module includes a spray system having a manifold connected to a source of fluid and a plurality of spray bars fluidly coupled to the manifold, and an adjustable height spray system configured to move the manifold and the plurality of spray bars up and down with respect to the conveyor system.

Embodiments of the cleaning apparatus further may include a lift mechanism configured to automatically move the manifold and the plurality of spray bars between a raised position and a lowered position. The lift mechanism may include a linear actuator, which is mounted on a wall of the at least one cleaning module by a bracket. The linear actuator may be controlled by a control module. The lift mechanism further may include a linkage assembly having two pivot links, with each pivot link being pivotally secured to the wall of the cleaning module, and a linkage bar, which connects the ends of the pivot links. A first pivot link of the two pivot links may be secured to a first pivot rod, which extends through the wall of the cleaning module, and a second pivot link of the two pivot links may be secured to a second pivot rod, which extends through the wall of the cleaning module. The adjustable height spray system further may include a spray support mechanism that is configured to support the manifold and spray bars. The spray support mechanism may be coupled to the lift mechanism by a first pivot rod coupled to the first pivot link and by a second pivot rod coupled to the second pivot link. The spray support mechanism may include a first support assembly that is connected to the first pivot rod and a second support assembly that is connected to the second rod. The first support assembly may include at least one first pivot member configured to releasably engage a first support bracket. The second support assembly may include at least one second pivot member configured to releasably engage a second support bracket. The first support bracket and the second support bracket may be secured to the manifold. The at least one pivot member of the first support assembly may include two pivot members secured to one another by a first pivot cross-member, and the at least one pivot member of the second support assembly may include two pivot members secured to one another by a second pivot cross-member. One of the first support bracket and the second support bracket may be configured to be releasably secured to its respective first pivot cross-member and second pivot cross-member. The manifold may include an elongated manifold body having an opening connected to the source of fluid, and several ports extending along a length of the manifold body. The ports may be configured to connect the manifold to the plurality of spray bars. Each spray bar may include an inlet port formed in the spray bar at a middle of the spray bar, with each spray bar being fluidly connected to a respective port of the manifold by a quick coupler clamp.

Another aspect of the present disclosure is directed to a method for cleaning electronic substrates with the cleaning apparatus. The method comprises: transporting an electronic substrate by the conveyor system through the at least one cleaning module; adjusting a height of the manifold and the plurality of spray bars with the adjustable height spray system; and performing a cleaning operation with the at least one cleaning module.

Yet another aspect of the present disclosure is directed to a spray system of a cleaning module of a cleaning apparatus to clean electronic substrates including printed circuit boards and semiconductor product assemblies. In one embodiment, the spray system comprises a manifold connected to a source of fluid, a plurality of spray bars fluidly coupled to the manifold, and an adjustable height spray system configured to move the manifold and the plurality of spray bars up and down with respect to the conveyor system.

Embodiments of the spray system further may include a lift mechanism configured to automatically move the manifold and the plurality of spray bars between a raised position and a lowered position. The lift mechanism may include a linear actuator, which is mounted on a wall of the at least one cleaning module by a bracket. The lift mechanism further may include a linkage assembly having two pivot links, with each pivot link being pivotally secured to the wall of the cleaning module, and a linkage bar, which connects ends of the pivot links. A first pivot link of the two pivot links may be secured to a first pivot rod, which extends through the wall of the cleaning module, and a second pivot link of the two pivot links may be secured to a second pivot rod, which extends through the wall of the cleaning module. The adjustable height spray system further may include a spray support mechanism that is configured to support the manifold and spray bars. The spray support mechanism may be coupled to the lift mechanism by a first pivot rod and a second pivot rod. The spray support mechanism may include a first support assembly that is connected to the first pivot rod and a second support assembly that is connected to the second rod. The first support assembly may include at least one pivot member configured to releasably engage a first support bracket. The second support assembly may include at least one pivot member configured to releasably engage a second support bracket. The first support bracket and the second support bracket may be secured to the manifold. The at least one pivot member of each of the first support assembly and the second support assembly may include two pivot members connected to one another by a pivot cross-member, with one of the pivot cross-members being held in place by a clamping assembly of a respective support bracket.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
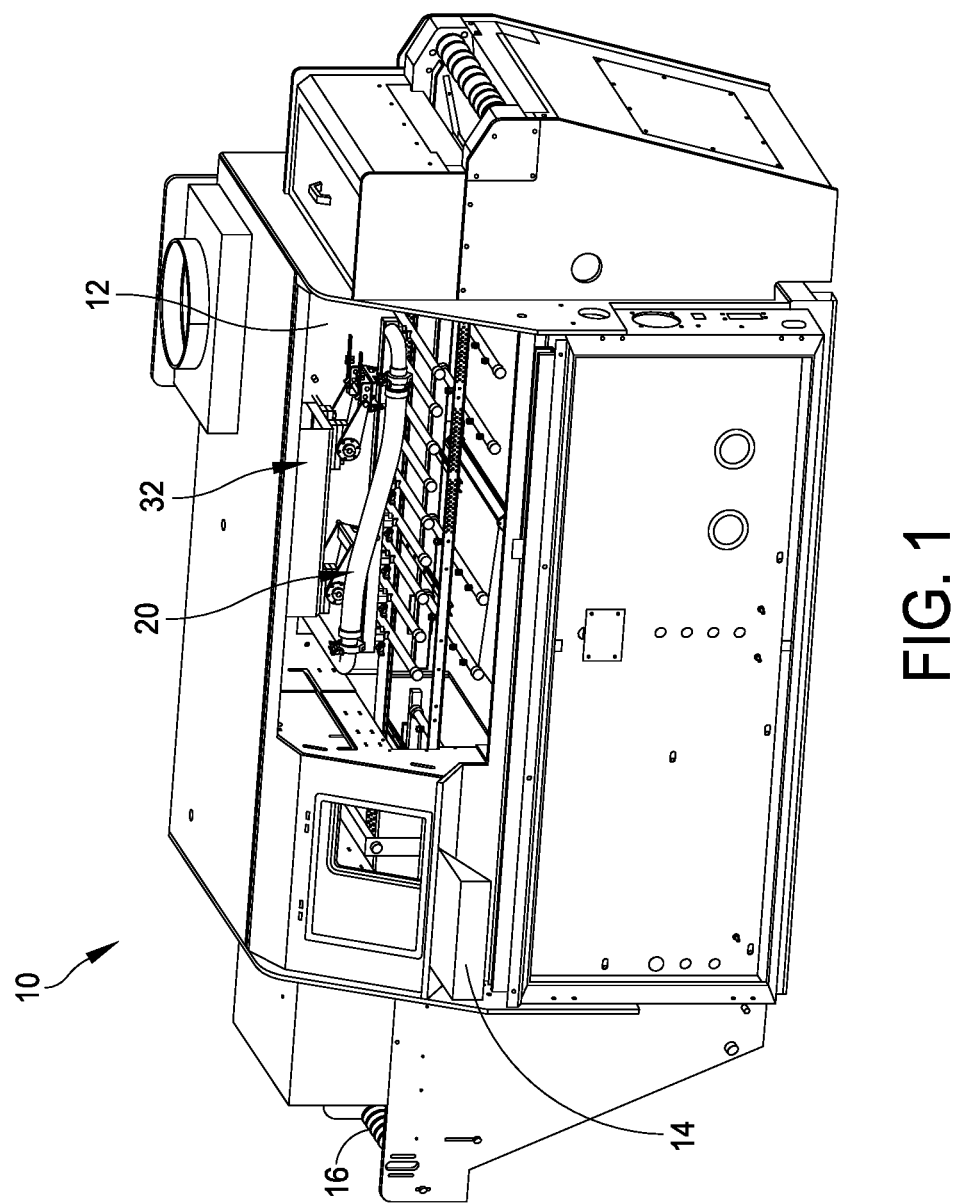
FIG. 1 is a perspective view of an electronic substrate cleaning apparatus.

Solder paste is routinely used in the assembly of electronic substrates, including printed circuit boards and semiconductor product assemblies, where the solder paste is used to join electronic components to the substrate. Solder paste includes solder for joint formation and flux for preparing metal surfaces for solder attachment. The solder paste may be deposited onto the metal surfaces (e.g., electronic pads) provided on the electronic substrate by using any number of application methods. In one example, a stencil printer may employ a squeegee to force the solder paste through a metallic stencil laid over an exposed surface of the electronic substrate. In another example, a dispenser may dispense solder paste material onto specific areas of the electronic substrate. Leads of an electronic component are aligned with and impressed into the solder deposits to form the assembly. In reflow soldering processes, the solder is then heated to a temperature sufficient to melt the solder and cooled to permanently couple the electronic component, both electrically and mechanically, to the electronic substrate. The solder typically includes an alloy having a melting temperature lower than that of the metal surfaces to be joined. The temperature also must be sufficiently low so as to not cause damage to the electronic component. In certain embodiments, the solder may be a tin-lead alloy. However, solders employing lead-free materials may also be used. Another process to attach components onto electronic substrates is a wave soldering process.

In the solder, the flux typically includes a vehicle, solvent, activators and other additives. The vehicle is a solid or nonvolatile liquid that coats the surface to be soldered and can include rosin, resins, glycols, polyglycols, polyglycol surfactants, and glycerine. The solvent, which evaporates during the pre-heat and soldering process, serves to dissolve the vehicle activators, and other additives. Examples of typical solvents include alcohols, glycols, glycol esters and/or glycol ethers and water. The activator enhances the removal of metal oxide from the surfaces to be soldered. Common activators include amine hydrochlorides, dicarboxylic acids, such as adipic or succinic acid, and organic acids, such as citric, malic or abietic acid. Other flux additives can include surfactants, viscosity modifiers and additives for providing low slump or good tack characteristics for holding the components in place before reflow.

As mentioned above, the soldering processes described herein leave unwanted contaminates on the electronic substrate, which must be cleaned prior to being released for use. Disclosed herein is an inline cleaning process to remove undesired contaminations from manufacturing processes. Specifically, a cleaning apparatus is used to clean unwanted materials left by the soldering process from the electronic substrate. Embodiments of the present disclosure are directed to a cleaning apparatus in which a height of spray nozzles of the cleaning apparatus can be automatically adjusted to adjust a distance between the spray nozzles and the electronic substrate that is being cleaned.

It is to be appreciated that embodiments of the systems and apparatuses discussed herein are not limited in application to the details of construction and the arrangement of components set forth in the following description or illustrated in the accompanying drawings. The systems and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Referring now to the drawings, and more particularly to FIG. 1, an electronic substrate cleaning apparatus is generally indicated at 10. As shown, the cleaning apparatus 10 includes a cleaning module, indicated at 12, which is provided to clean and process components, including electronic substrates and semiconductor wafers, for example. The cleaning apparatus 10 can include one or more modules used for cleaning, drying, and the like. A control module having a user interface together indicated at 14 provides an operator the ability to program and monitor the operation of the cleaning apparatus 10. In certain embodiments, the cleaning apparatus 10 may include a Aquastorm® series cleaner platform offered by Electrovert Cleaners, ITW Electronic Assembly Equipment of Camdenton, Missouri.

Figure 2:
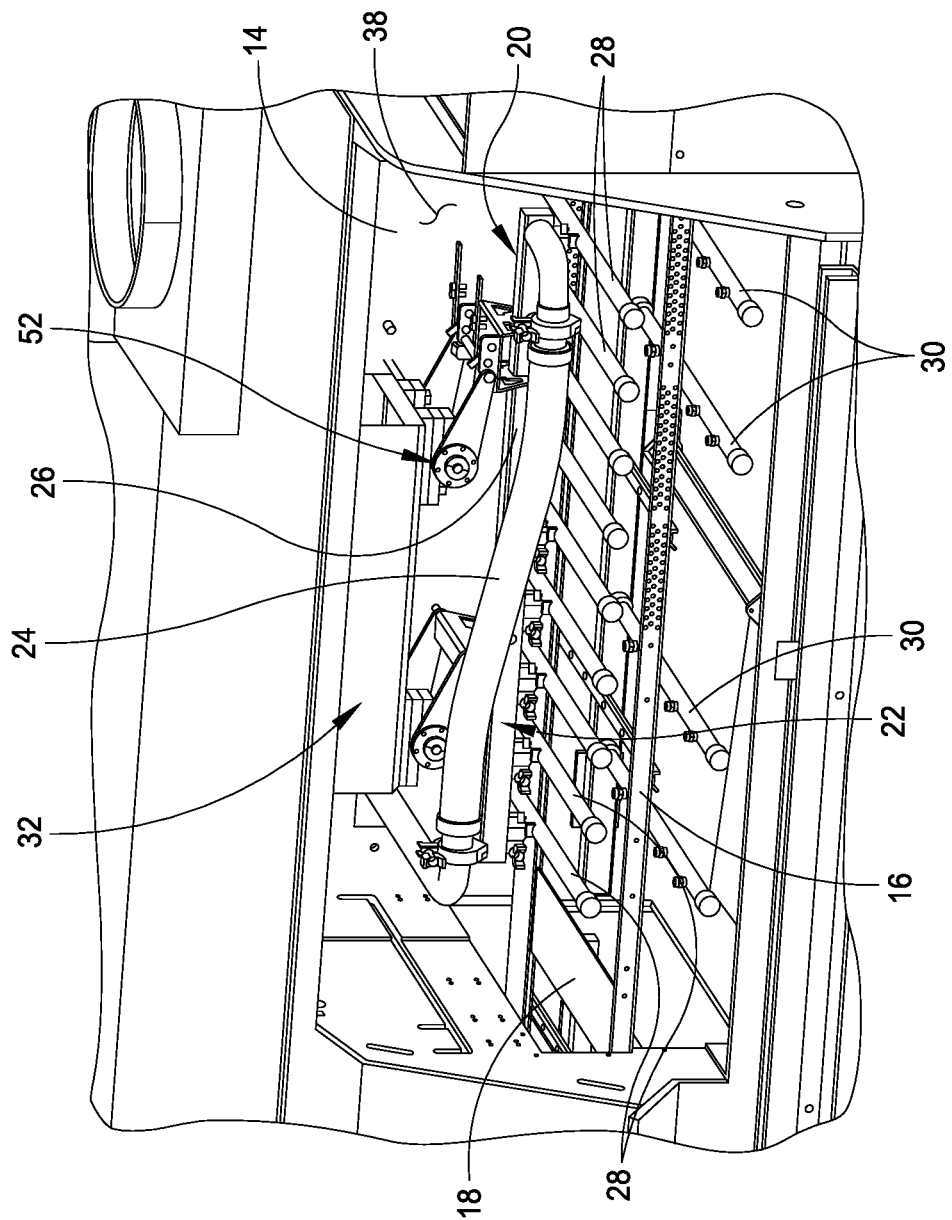
FIG. 2 is a perspective view of a cleaning module of the cleaning apparatus.

The cleaning apparatus 10 further includes an elongate conveyor 16 that is configured to transport electronic substrates, e.g., electronic substrate 18 shown in FIG. 2, through the cleaning module 12 of the cleaning apparatus. As mentioned above, the electronic substrate 18 can include printed circuit boards and semiconductor product assemblies. The conveyor 16 is designed to securely hold the electronic substrate 18 during the sometimes rigorous cleaning processes. Sometimes trays are used to support the items being transported through the cleaning apparatus 10 by the conveyor 16 for cleaning. Embodiments of the present disclosure are directed to an adjustable height spray system that is used to spray fluid on items contained within the cleaning module to clean the components during a cleaning operation.

Figure 3:
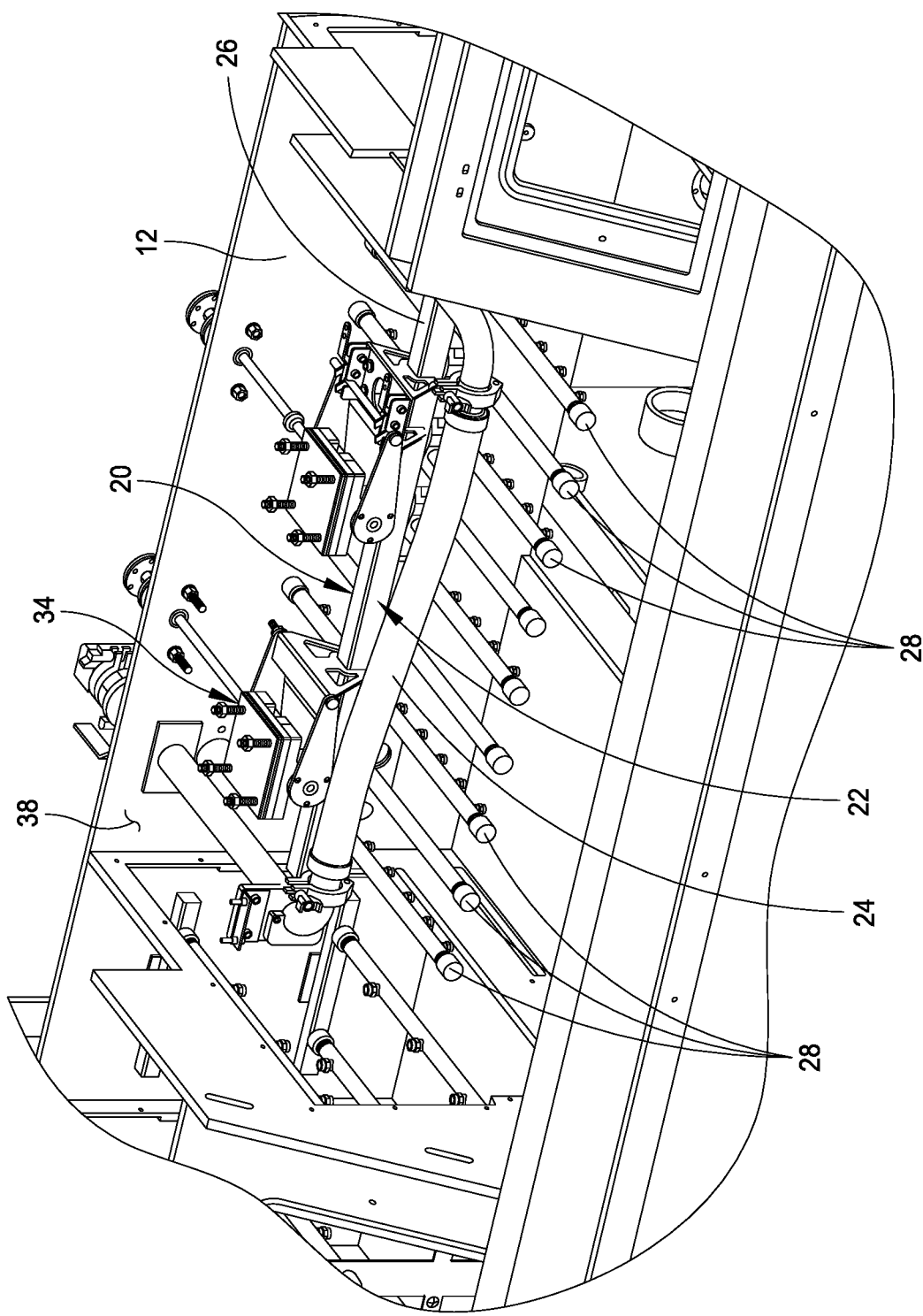
FIG. 3 is another perspective view of the cleaning module of the cleaning apparatus.

Referring to FIGS. 2 and 3, the cleaning module of the cleaning apparatus includes a spray system, generally indicated at 20. As shown, the spray system 20 includes a manifold, generally indicated at 22, which is connected to a source of fluid, e.g., supply hose 24. Specifically, the manifold 22 includes an elongated manifold body 26 having an opening connected to the source of fluid, and several ports or nipples extending along a length of the manifold body, the ports being used to connect the manifold to spray bars, each indicated at 28. The spray bars 28 are positioned above the conveyor 16 to clean surfaces of components requiring cleaning facing upwardly on the conveyor. The spray system 20 further includes spray bars, each indicated at 30, positioned below the conveyor 16 to clean surfaces of components facing downwardly on the conveyor. The spray system 20 further is configured to recycle fluid used during the cleaning process.

The cleaning module 12 of the cleaning apparatus 10 further includes an adjustable height spray system, generally indicated at 32, which is provided to adjust a height of the spray system 20 above the conveyor 16. The adjustable height spray system 32 is configured to move the manifold 22 and the spray bars 28 up and down with respect to the conveyor 16 carrying the components for cleaning. Depending on the width or thickness of the components being cleaned, sometimes it is desirable to move the spray bars 28 up or down to optimize a distance that the spray bars apply cleaning fluid on the components. In some embodiments, the adjustable height spray system 32 is configured to raise and lower the spray bars 28 a distance between 3-5 inches.

Figure 4:
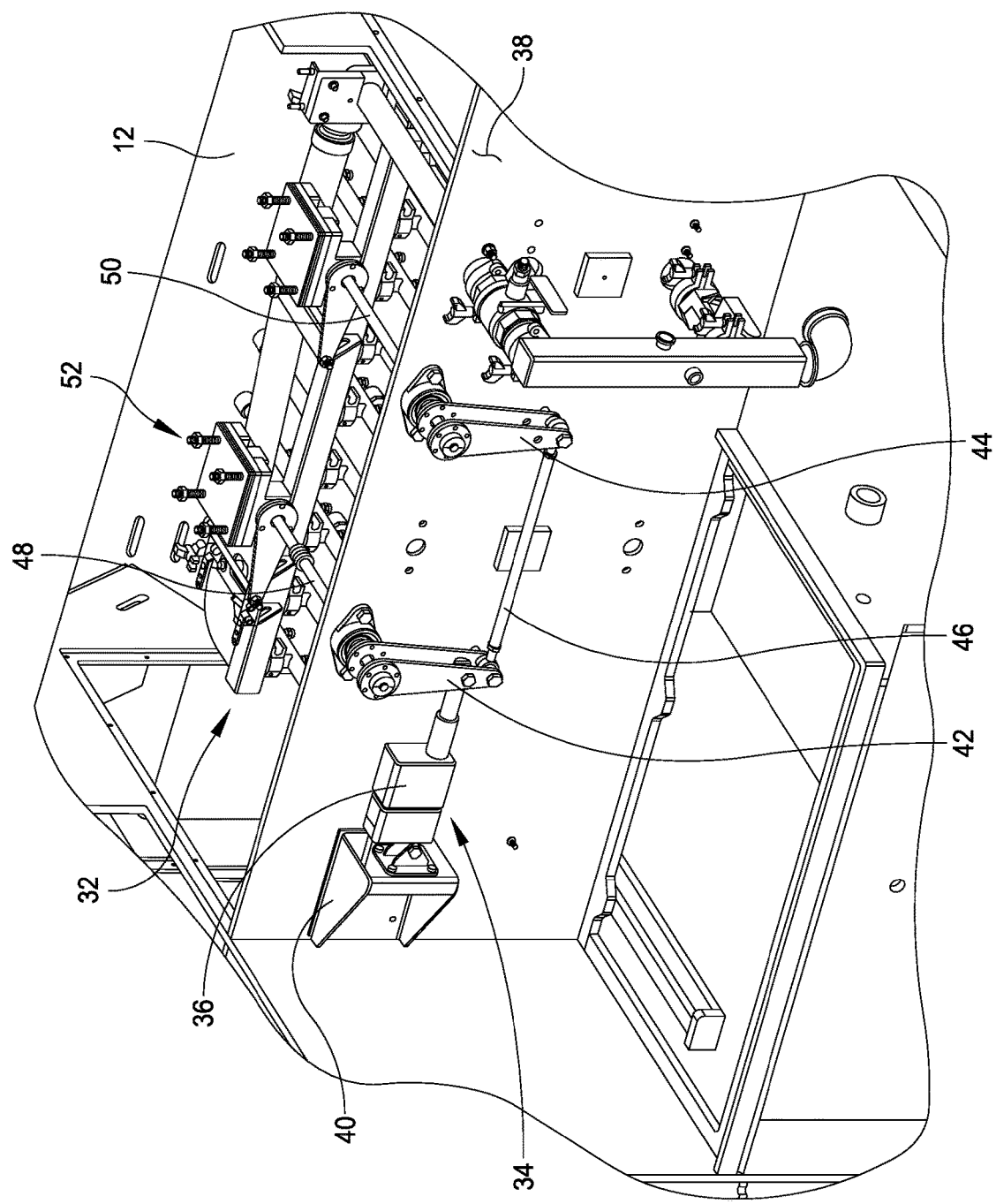
FIG. 4 is another perspective view of the cleaning module of the cleaning apparatus.

Referring to FIG. 4, the adjustable height spray system 32 includes a lift mechanism, generally indicated at 34, that is designed to automatically move the manifold 22 and the spray bars 28 between their raised and lowered positions. As shown, the lift mechanism 34 includes a linear actuator 36, which is mounted on a wall 38 of the cleaning module 12 by a bracket 40. The linear actuator 36 may include any type of actuator that is controlled by the control module 14 of the cleaning apparatus 10. The lift mechanism 34 further includes a linkage assembly having two pivot links 42, 44, each pivotally secured to the wall of the cleaning module, and a linkage bar 46, which connects the ends of the pivot links. The first pivot link 42 is secured to a first pivot rod 48, which extends through the wall 38 of the cleaning module 12 through an opening in the wall. Similarly, the second pivot link 44 is secured to a second pivot rod 50, which extends through the wall of the cleaning module through another opening in the wall.

As shown, the linear actuator 36 is positioned to move the first pivot link 42 to rotate the first pivot rod 48 about an axis. Since the linkage bar 46 connects the first pivot link 42 to the second pivot link 44, the second pivot link also rotates the second pivot rod 50 about an axis that is parallel to the axis of the first pivot rod 48. Thus, the linear actuator 36 is provided to rotate the first pivot rod 48 the same amount as the second pivot rod 50. As shown in FIG. 4, the first pivot link 42 and the second pivot link 44 of the adjustable height spray system 32 are positioned to locate the spray system 20 including the manifold 22 and the spray bars 28 in the lowered position.

Figure 5:
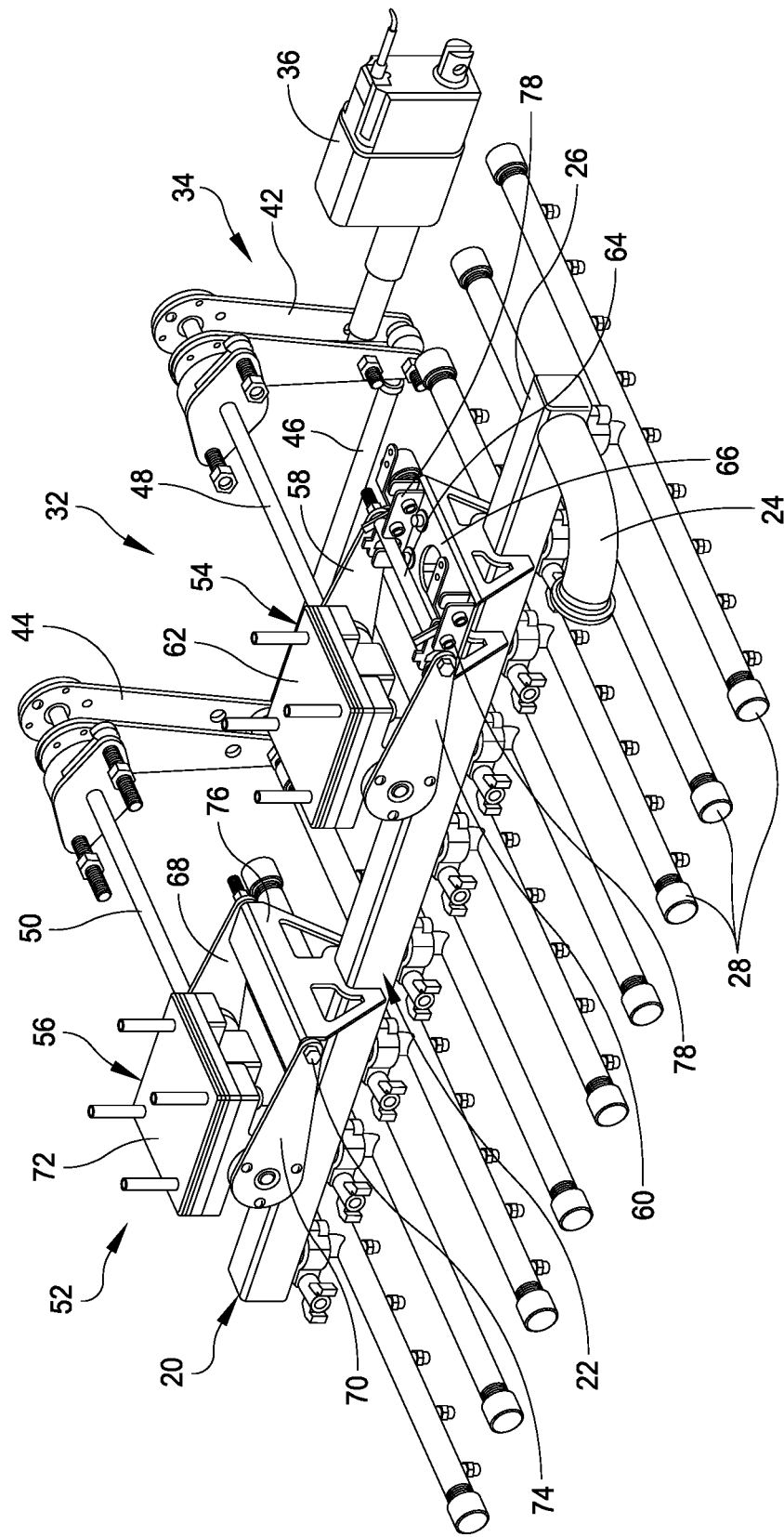
FIG. 5 is a perspective view of an adjustable height spray system of the cleaning module.
Figure 6:
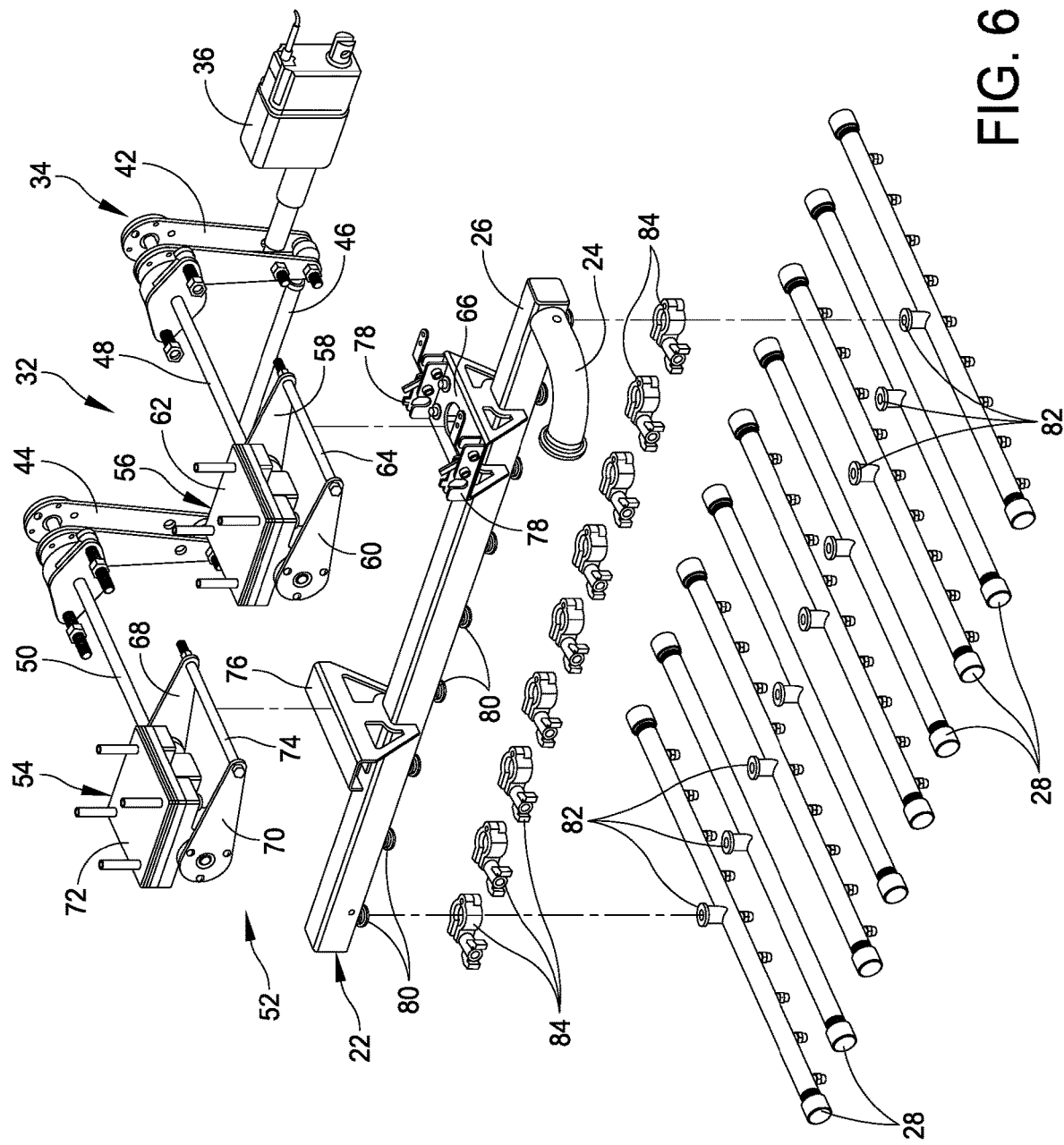
FIG. 6 is an exploded perspective view of the adjustable height spray system.
Figure 7:
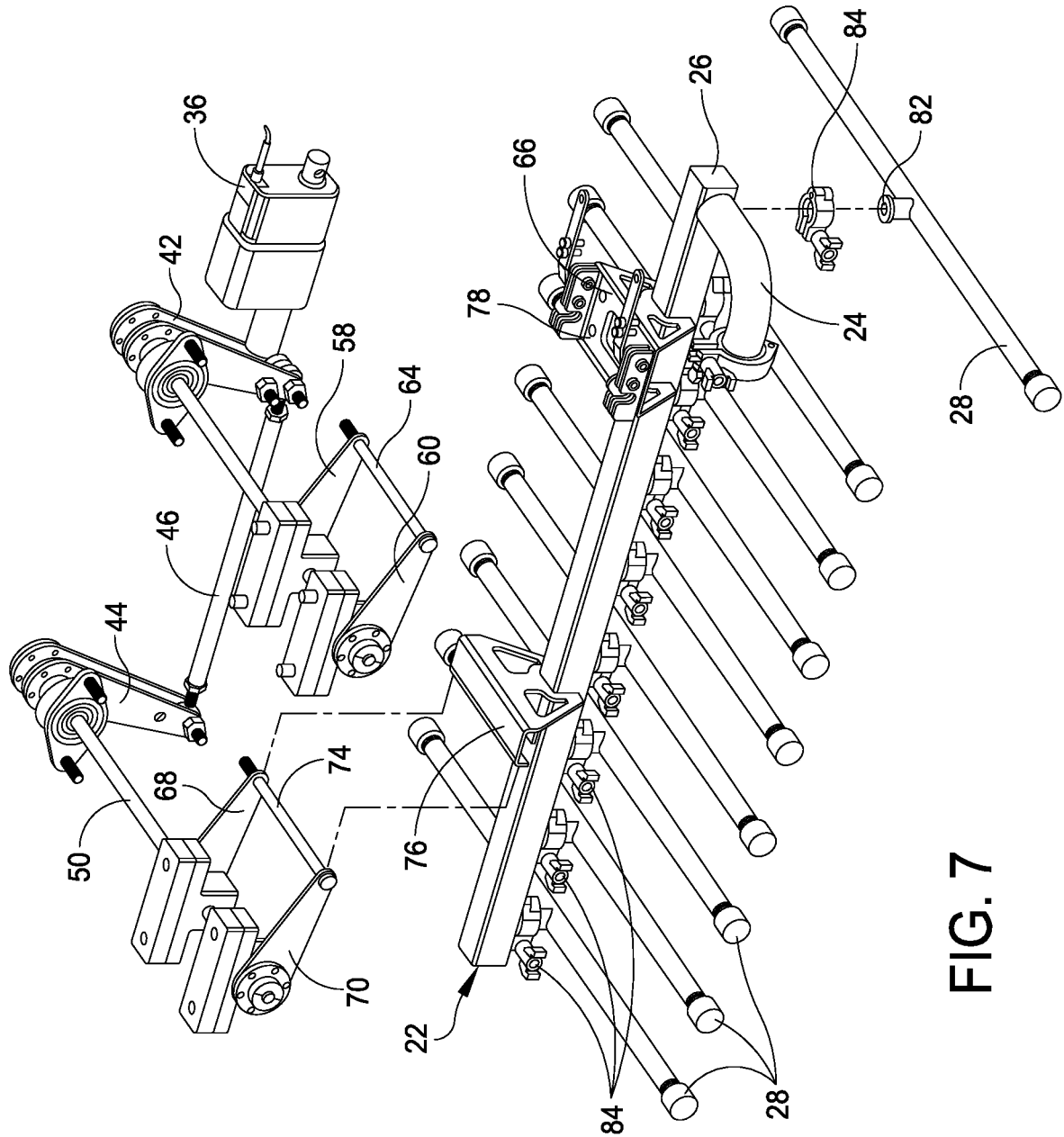
FIG. 7 is another exploded perspective view of the adjustable height spray system.

Referring to FIGS. 5-7, the adjustable height spray system 32 further includes a spray support mechanism, generally indicated at 52, that is configured to support the components of the spray system 20 including the manifold 22 and the spray bars 28. As shown, the spray support mechanism 52 is coupled to the lift mechanism 34 by the first pivot rod 48 and the second pivot rod 50.

The spray support mechanism 52 includes a first support assembly, generally indicated at 54, that is connected to the first pivot rod 48, and a second support assembly, generally indicated at 56, that is connected to the second rod 50. The first support assembly 54 includes two pivot members 58, 60 that are mounted on a first support plate 62. The pivot members 58, 60 are rotatably connected to the first pivot rod 48 of the lift mechanism 34. The pivot members 58, 60 are connected to one another by a pivot cross-member 64, which is configured to releasably engage a first support bracket 66. As shown, the first support bracket 66 is secured to the manifold body 26 of the manifold 22.

Similarly, the second support assembly 56 includes two pivot members 68, 70 that are mounted on a second support plate 72. The pivot members 68, 70 are connected to the second pivot rod 50 of the lift mechanism 34. The pivot members 68, 70 are connected to one another a pivot cross-member 74, which is configured to releasably engage a second support bracket 76. As shown, the second support bracket 76 is secured to the manifold body 26 of the manifold 22, which is spaced from the first support member 66.

When securing the first pivot cross-member 64 of the first support assembly 54, the first pivot cross-member is held in place by two clamping assemblies, each indicated at 78, of the first support bracket 66. Each clamping assembly 78 is configured to releasably secure the first support bracket 66 to the first pivot cross-member 64 thereby releasably securing the manifold body 26 of the manifold 22 to the spray support mechanism 52. When securing the second pivot cross-member 74 of the second support assembly 56, the second pivot cross-member is positioned under a channel of the second support bracket 76. Thus, the manifold 22 and the spray bars 28 are secured to the spray support mechanism 52 by first positioning the second pivot cross-member 74 of the second support assembly 56 under the channel of the second support bracket 76. Next, the first pivot cross-member 64 of the first support assembly 54 is positioned adjacent the clamping assemblies 78 of the first support bracket 66 and the clamping assemblies are closed to secure the first pivot cross-member.

The arrangement is such that when the lift mechanism 34 is operated by activating the linear actuator 36 to rotate the first pivot rod 48 and the second pivot rod 50 to initiate the rotation of the first support assembly 54 and the second support assembly 56, respectively. The rotational movement of the first support assembly 54 and the second support assembly 56 cause the up-and-down movement of the manifold 22 and the spray bars 28 to a desired elevation above the conveyor 16. And since the pivot rods 48, 50 cause the rotation of the first support assembly 54 and the second support assembly 56, respectively, the manifold 22 and spray bars 28 are moved vertically while maintaining a generally horizontal orientation.

Referring particularly to FIGS. 6 and 7, the manner in which the manifold body 26 of the manifold 22 is secured to each spray bar 28 is shown. As mentioned above, the manifold body 26 of the manifold 22 includes a plurality of ports, each indicated at 80, formed along a bottom surface of the manifold body along a length of the manifold body. Each spray bar 28 includes an inlet port, indicated at 82, formed in the spray bar at a middle of the spray bar. The inlet port 82 of each spray bar 28 is fluidly connected to a respective port 80 of the manifold body 26 by a quick coupler clamp, indicated at 84, which is configured to connect the port of the manifold the inlet port of the spray bar. One or more valves (not shown) may be provided to control the flow of fluid to the ports. As shown, the spray bars 28 are evenly spaced from one another along a length of the manifold body 26 and extend perpendicularly with respect to the manifold body along a generally horizontal plane.

Figure 8:
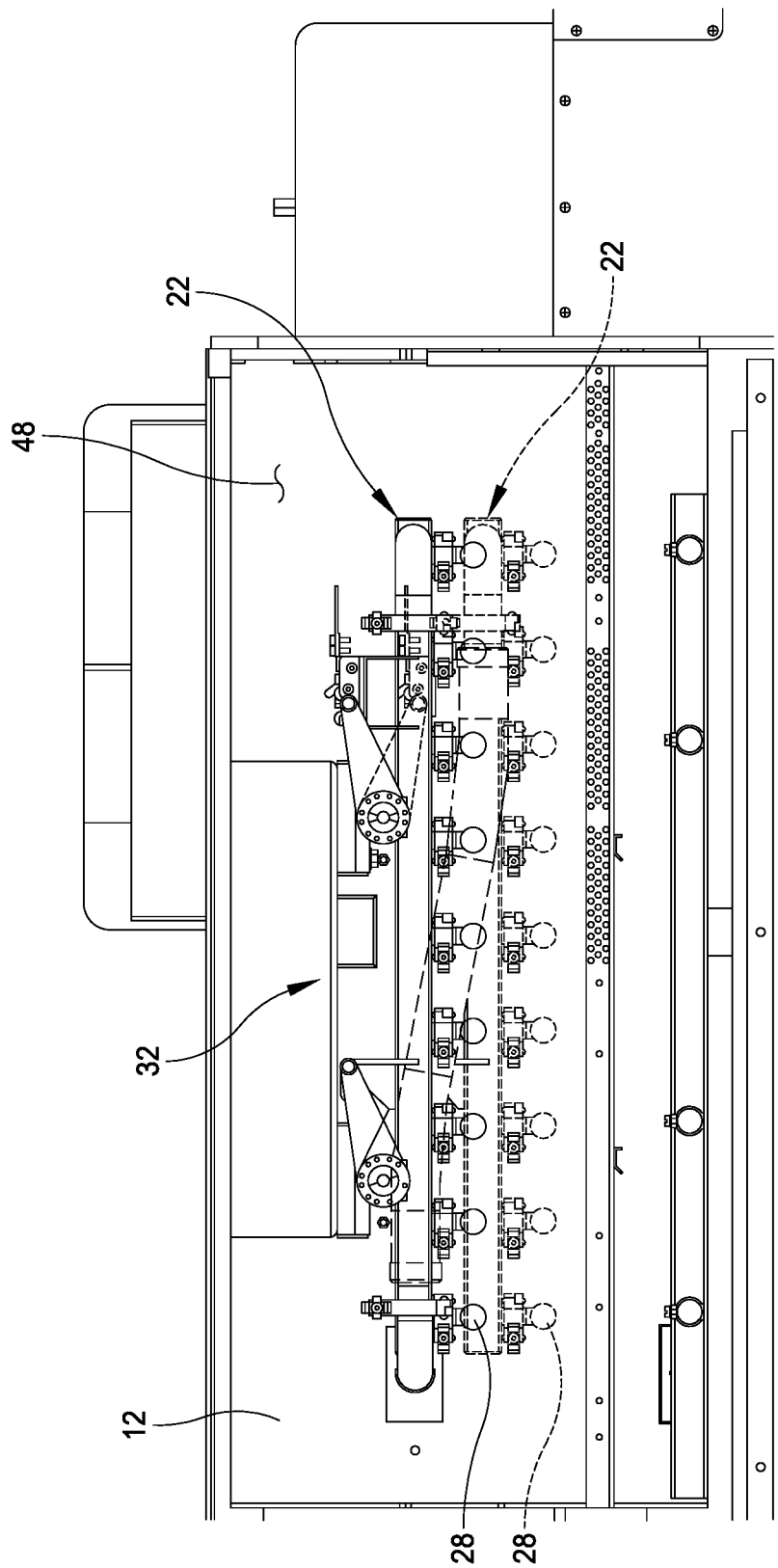
FIG. 8 is an enlarged side view of the cleaning apparatus showing the spray nozzles in the raised and lowered positions.

Referring to FIG. 8, the spray bars 28 are shown in their raised and lowered positions. As shown, the manifold 22 and the spray bars 28 are illustrated in solid lines in the raised position and are illustrated in dashed lines in the lowered position. The adjustable height spray system 32 can be configured to achieve a desired elevation above the conveyor depending on the particular application. As mentioned above, the control module 14 can be configured to control the linear actuator 36 of the lift mechanism 34 of the adjustable height spray system 32 to raise and lower to a desired elevation by controlling the linear actuator 36.

In some embodiments, a method for cleaning electronic substrates with the cleaning apparatus 10 is further provided. In one embodiment, the method of cleaning includes transporting electronic substrates by the conveyor system 16 through the cleaning module 12 of the cleaning apparatus 10, and performing a cleaning operation on the electronic substrates. In a certain embodiment, the cleaning operation is controlled by the control module 14 of the cleaning apparatus 10.

It is to be understood that the above description is intended by way of illustration and example only and is not intended to be taken by way of limitation, and that changes and modifications are possible. For example, the cleaning apparatus 10 described above may be any type of cleaning machine that is used to clean electronic substrates. Accordingly, other embodiments are contemplated, and modifications and changes could be made without departing from the scope of this application.

In one embodiment, the control module 14 of the cleaning apparatus 10 is configured with an operating system, e.g., a Windows®-based operating system, which provides familiar pull-down menus and has data-logging and barcode capability. The operating system is easily networked for downloading of recipes and remote access to operating data. The user interface enables quick and easy viewing of system pressures, water levels, pump and blower operation, temperature, and fill/drain operation. Moreover, the user interface can be configured to control the operation of the adjustable height spray system, and in particular, the actuator.

Various controllers, such as the control module 14, may execute various operations discussed above. Using data stored in associated memory and/or storage, the control module 14 also executes one or more instructions stored on one or more non-transitory computer-readable media, which the control module 14 may include and/or be coupled to, that may result in manipulated data. In some examples, the control module 14 may include one or more processors or other types of controllers. In one example, the control module 14 is or includes at least one processor. In another example, the control module 14 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Many process parameters may be configured in a computer-controlled operator interface provided in the cleaning apparatus 10. System pressure, water levels, and temperatures are easily accessed. Data logging and barcode capability are features that enhance and streamline the production process.

In some embodiments, the cleaning apparatus 10 may be configured to include nozzles, including "jet" nozzles, to apply a maximum direct dynamic impingement to the product surface and effectively clean under low stand-off components for difficult cleaning applications. The nozzles can be configured to produce large water droplets to enhance the cleaning performance of the cleaning apparatus when operating at a lower rate of pressure. The nozzles can be configured to produce an oscillating action to better clean and flush flux residues in a prewash to reduce foaming in the recirculating wash.

In some embodiments, the cleaning apparatus 10 can be equipped with orbitally welded, stainless steel plumbing to eliminate pressure drops and leaks, all sections can be replaced or upgraded in minutes to maximize uptime and process flexibility. Plumbing sections have quick-disconnect fittings for ease of maintenance.

In some embodiments, the cleaning apparatus 10 can include one or more rear panels, which can be easily removed for maintenance. Front doors further can be provided to provide quick access to electrical panels, computer, heaters, floats and thermocouples. The cleaning apparatus 10 can include hinged, tempered glass windows to provide optimum viewing and access.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A cleaning apparatus for cleaning electronic substrates including printed circuit boards and semiconductor product assemblies, the cleaning apparatus comprising:
   at least one cleaning module configured to treat electronic substrates; and
   a conveyor system configured to transport the electronic substrates through the at least one cleaning module, the at least one cleaning module including
  a spray system having a manifold connected to a source of fluid and a plurality of spray bars fluidly coupled to the manifold, and
  an adjustable height spray system configured to move the manifold and the plurality of spray bars up and down with respect to the conveyor system, the adjustable height spray system including a lift mechanism configured to automatically move the manifold and the plurality of spray bars between a raised position and a lowered position, the lift mechanism including a linear actuator, which is mounted on a wall of the at least one cleaning module by a bracket, and a linkage assembly having two pivot links, each pivot link being pivotally secured to the wall of the cleaning module, and a linkage bar, which connects the ends of the pivot links.

2. The cleaning apparatus of claim 1, wherein the linear actuator is controlled by a control module.

3. The cleaning apparatus of claim 1, wherein a first pivot link of the two pivot links is secured to a first pivot rod, which extends through the wall of the cleaning module, and a second pivot link of the two pivot links is secured to a second pivot rod, which extends through the wall of the cleaning module.

4. The cleaning apparatus of claim 1, wherein the adjustable height spray system further includes a spray support mechanism that is configured to support the manifold and spray bars.

5. The cleaning apparatus of claim 4, wherein the spray support mechanism is coupled to the lift mechanism by a first pivot rod coupled to the first pivot link and by a second pivot rod coupled to the second pivot link.

6. The cleaning apparatus of claim 5, wherein the spray support mechanism includes a first support assembly that is connected to the first pivot rod and a second support assembly that is connected to the second rod.

7. The cleaning apparatus of claim 6, wherein
  the first support assembly includes at least one first pivot member configured to releasably engage a first support bracket, and
  the second support assembly includes at least one second pivot member configured to releasably engage a second support bracket,
  wherein the first support bracket and the second support bracket are secured to the manifold.

8. The cleaning apparatus of claim 7, wherein
  the at least one pivot member of the first support assembly includes two pivot members secured to one another by a first pivot cross-member, and
  the at least one pivot member of the second support assembly includes two pivot members secured to one another by a second pivot cross-member,
  wherein one of the first support bracket and the second support bracket is configured to be releasably secured to its respective first pivot cross-member and second pivot cross-member.

9. The cleaning apparatus of claim 1, wherein the manifold includes an elongated manifold body having an opening connected to the source of fluid, and several ports extending along a length of the manifold body, the ports being configured to connect the manifold to the plurality of spray bars.

10. A method for cleaning electronic substrates with the cleaning apparatus of claim 1, the method comprising:
  transporting an electronic substrate by the conveyor system through the at least one cleaning module;
  adjusting a height of the manifold and the plurality of spray bars with the adjustable height spray system; and
  performing a cleaning operation with the at least one cleaning module.

11. A cleaning apparatus for cleaning electronic substrates including printed circuit boards and semiconductor product assemblies, the cleaning apparatus comprising:
  at least one cleaning module configured to treat electronic substrates; and
  a conveyor system configured to transport the electronic substrates through the at least one cleaning module,
  the at least one cleaning module including
    a spray system having a manifold connected to a source of fluid and a plurality of spray bars fluidly coupled to the manifold, and
    an adjustable height spray system configured to move the manifold and the plurality of spray bars up and down with respect to the conveyor system,
  wherein each spray bar includes an inlet port formed in the spray bar at a middle of the spray bar, each spray bar being fluidly connected to a respective port of the manifold by a quick coupler clamp.

12. A spray system of a cleaning module of a cleaning apparatus to clean electronic substrates including printed circuit boards and semiconductor product assemblies, the spray system comprising:
  a manifold connected to a source of fluid;
  a plurality of spray bars fluidly coupled to the manifold; and
  an adjustable height spray system configured to move the manifold and the plurality of spray bars up and down with respect to the conveyor system, the adjustable height spray system including a lift mechanism configured to automatically move the manifold and the plurality of spray bars between a raised position and a lowered position, the lift mechanism including a linear actuator, which is mounted on a wall of the at least one cleaning module by a bracket, and a linkage assembly having two pivot links, each pivot link being pivotally secured to the wall of the cleaning module, and a linkage bar, which connects ends of the pivot links.

13. The spray system of claim 12, wherein a first pivot link of the two pivot links is secured to a first pivot rod, which extends through the wall of the cleaning module, and a second pivot link of the two pivot links is secured to a second pivot rod, which extends through the wall of the cleaning module.

14. The spray system of claim 12, wherein the adjustable height spray system further includes a spray support mechanism that is configured to support the manifold and spray bars.

15. The spray system of claim 14, wherein the spray support mechanism is coupled to the lift mechanism by a first pivot rod and a second pivot rod.

16. The spray system of claim 15, wherein the spray support mechanism includes a first support assembly that is connected to the first pivot rod and a second support assembly that is connected to the second rod.

17. The spray system of claim 16, wherein
  the first support assembly includes at least one pivot member configured to releasably engage a first support bracket, and
  the second support assembly includes at least one pivot member configured to releasably engage a second support bracket,
  wherein the first support bracket and the second support bracket are secured to the manifold.

18. The spray system of claim 17, wherein the at least one pivot member of each of the first support assembly and the second support assembly includes two pivot members connected to one another by a pivot cross-member, with one of the pivot cross-members being held in place by a clamping assembly of a respective support bracket.

\* \* \* \* \*